(12) United States Patent
Rubin

(10) Patent No.: US 6,654,009 B2
(45) Date of Patent: Nov. 25, 2003

(54) METHOD AND APPARATUS FOR ARRANGING ENTITIES IN A TWO-DIMENSIONAL LATTICE

(76) Inventor: Seth Rubin, 2206 Washington St., Merrick, NY (US) 11566

( * ) Notice: Subject to any disclaimer, the term of this patent is extended or adjusted under 35 U.S.C. 154(b) by 314 days.

(21) Appl. No.: 09/863,695

(22) Filed: May 23, 2001

(65) Prior Publication Data

US 2001/0048433 A1 Dec. 6, 2001

Related U.S. Application Data

(60) Provisional application No. 60/206,357, filed on May 23, 2000.

(51) Int. Cl.[7] .................................................. G06T 1/00
(52) U.S. Cl. ........................ 345/418; 345/677; 715/517; 715/518; 705/27
(58) Field of Search ................... 345/765, 788, 345/173, 418, 420, 764, 677, 700, 716; 382/305, 304, 311, 312; 706/11, 55; 715/517, 530, 518, 519; 705/26, 27

(56) References Cited

U.S. PATENT DOCUMENTS

| | | | | |
|---|---|---|---|---|
| 4,905,163 A | * | 2/1990 | Garber et al. | 706/55 |
| 5,500,937 A | * | 3/1996 | Thompson-Rohrlich | 345/764 |
| 5,956,738 A | * | 9/1999 | Shirakawa et al. | 715/517 |
| 6,054,991 A | * | 4/2000 | Crane et al. | 345/420 |
| 6,181,838 B1 | * | 1/2001 | Knowlton | 382/305 |

\* cited by examiner

*Primary Examiner*—Mark Zimmerman
*Assistant Examiner*—Lance W. Sealey
(74) *Attorney, Agent, or Firm*—Dilworth & Barrese, LLP

(57) ABSTRACT

A method for arranging entities in a two-dimensional lattice including the steps of determining all applicable two-dimensional lattice forms from a predetermined group of lattice forms for a predetermined number of entities to be arranged; determining the dimensions of a bounding region and a uniform separation distance between a center point of each entity for each applicable lattice form; selecting an optimal applicable two-dimensional lattice form; and plotting positions of each of the predetermined number of entities within the optimal applicable two-dimensional lattice form.

16 Claims, 6 Drawing Sheets

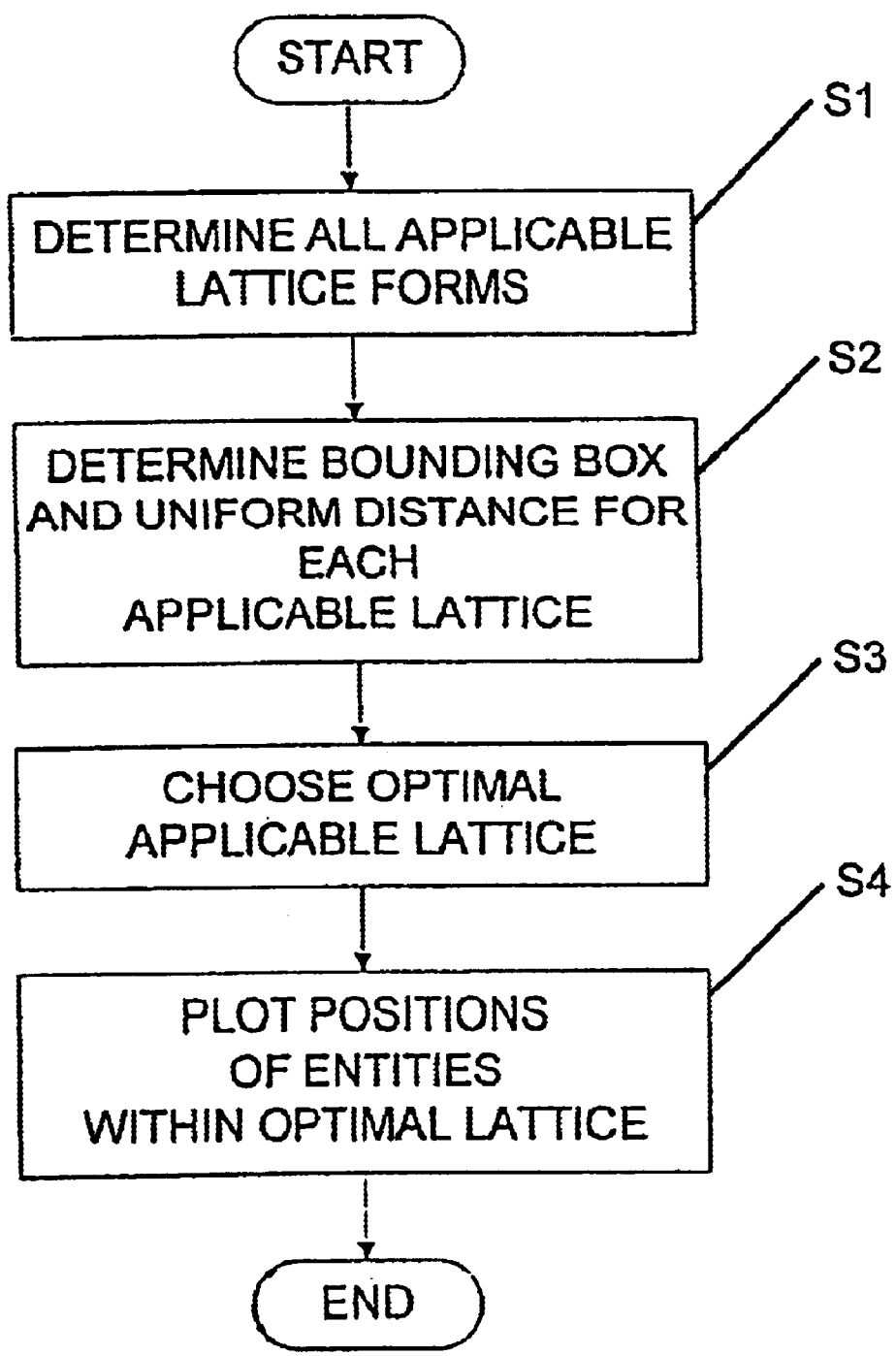

*Fig 8*
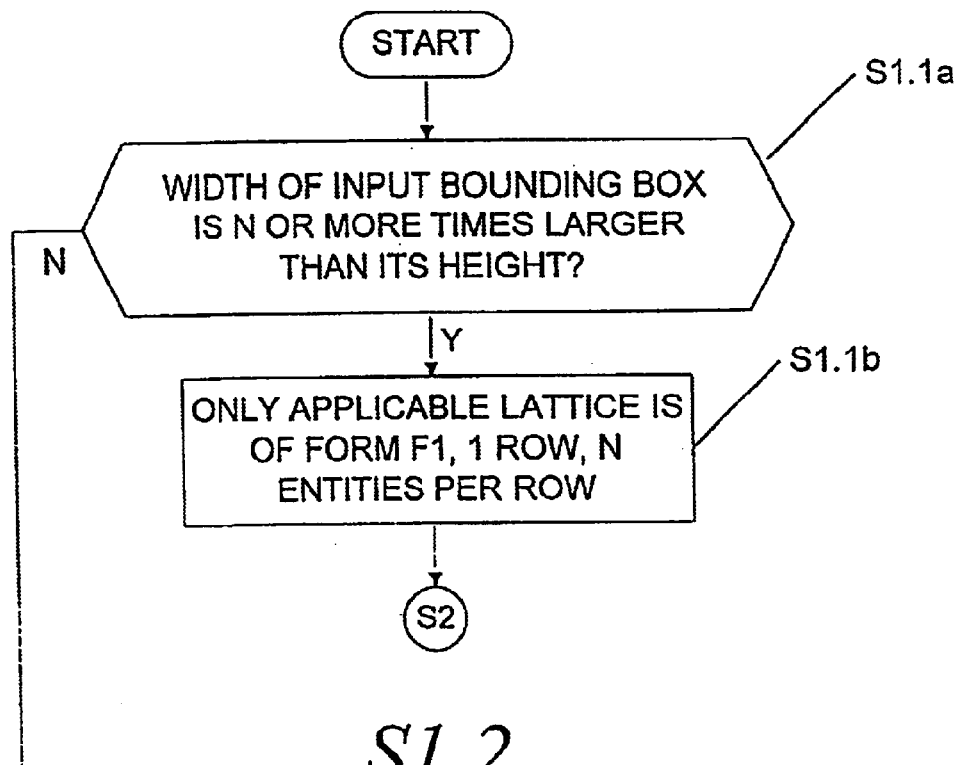
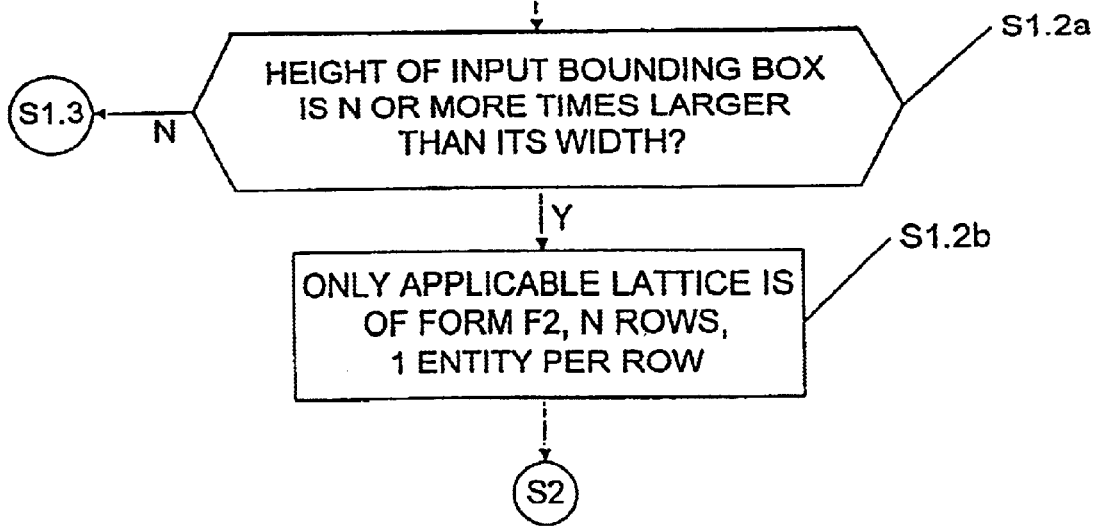

S1.3

Fig 10
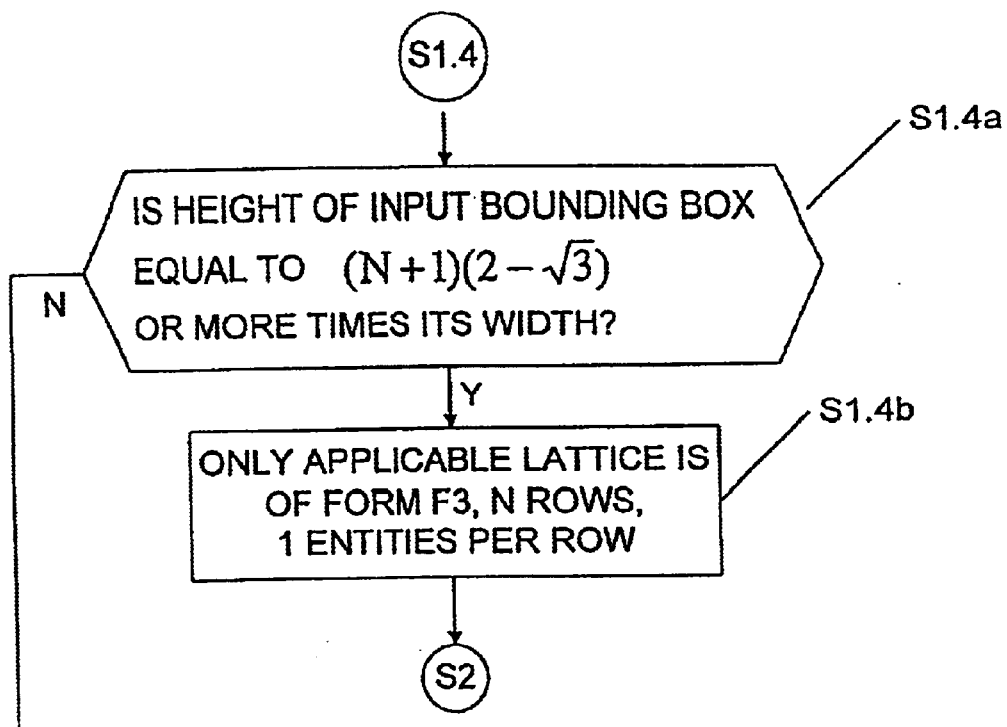
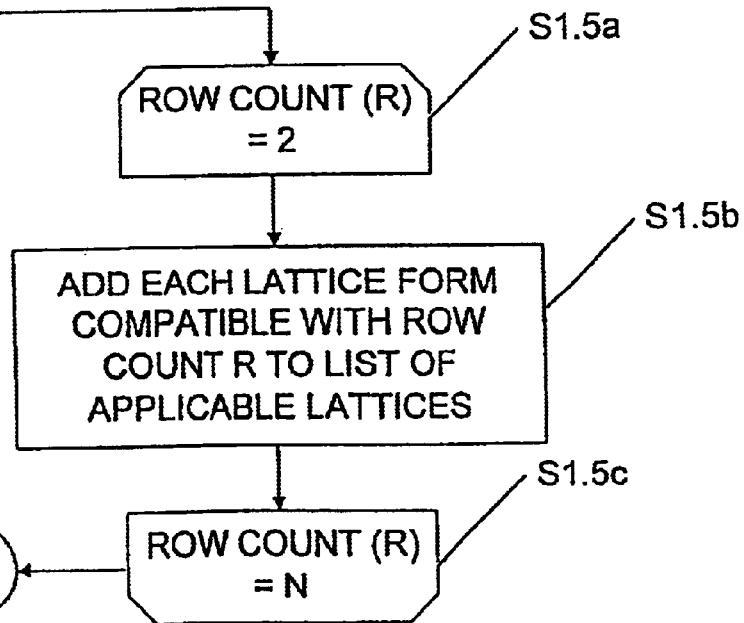

METHOD AND APPARATUS FOR ARRANGING ENTITIES IN A TWO-DIMENSIONAL LATTICE

CROSS-REFERENCE TO RELATED APPLICATION

The present application claims priority to U.S. Provisional Application Serial No. 60/206,357 filed May 23, 2000, the entire contents of this applications is hereby incorporated by reference.

BACKGROUND

1. Technical Field

The present invention relates to a method for arranging entities, and more particularly to a method for dynamically arranging entities within a two-dimensional workspace in a symmetrical lattice, while maximizing the distance between entities.

2. Description of Related Art

Companies displaying information on the internet or designers for such companies often need a flexible way to display dynamic groupings of information for viewing by a user on a display such as items on sale, accounts, a menu of selections, etc. Conventionally the only extant methods available for arranging this information are traditional structures, such as a list or a collection of rectangular buttons arranged in a grid. These methods often lack visual appeal, thereby detracting from a user's attention to the information.

Additionally other areas, for example, manufacturing design, packaging design, clothing design, landscape design often utilize two-dimensional designs to plan the distribution of objects.

There are also pre-arranged patterns of other, more visually appealing shapes. However, conventional pre-arranged patterns lack the flexibility of automatically varying the size and quantities of items to fill a workspace.

Visually oriented design programs such as Visio™, AutoCad™ and other similar types of software have functions that allow a user to evenly distribute the spacing of objects. However, such functions only work in vertical and horizontal directions, giving no facility for uniform distribution of objects in other directions.

Many artistic or mathematical-interest computer programs offer repeated patterns of a shape through a method commonly referred to as "tiling". In such programs, only one shape is involved and its form must be such that can be placed immediately adjacent to copies of itself with no intervening space in any direction.

Some mathematicians, such as Kenneth Stephenson of the University of Tennessee, have published papers on circle-packing, addressing the practice of arranging circles tangentially within various geometric shapes. The rules for packing are such that it is not always practical for display applications.

Accordingly, a continuing need exists for methods of uniformly and arranging objects in a two dimensional work space in a symmetrical lattice while maximizing the distance between adjacent entities.

SUMMARY OF THE INVENTION

It is therefore an object of the present invention to provide a method for dynamic symmetric uniform distribution of entities that does not follow a simple orthogonal grid or list arrangement, thereby providing greater visual appeal or optional arrangement of physical entities.

It is another object of the present invention to provide a method for dynamically, symmetrically, and uniformly distributing entities to facilitate the design of static arrangements, e.g. textiles, publishing, graphic arts, product design, landscape design building materials, as well as applications in which arrangements must be produced dynamically, e.g. computer displays of choices, computer displays of collections of data and to facilitate certain types of object packing for industrial or scientific applications.

To achieve the above objects and others, a method in accordance with the invention is provided which positions any number of entities (N) in rows and columns within a two-dimensional workspace, such that the center of each entity is an equal maximal distance (D) from the center of its closest neighbors, and at least half the same distance (D) from the boundaries of the area given. This distance (D) also represents the maximum diameter of the perimeter that each entity can lie completely within, without crossing another entity's perimeter or any boundary of the workspace. The method can be utilized to achieve maximum entity perimeter/diameter or, to achieve the largest workspace possible within other known criteria, as described further hereinbelow. In most cases, the results are identical.

The workspace is an area whose edges are at a distance of D/2 from the centers of each of the outermost entities of the arrangement. Given the number of entities to be arranged (N), the dimensions of an enclosing workspace, an orientation preference (A or B), and an indication whether its primary objective is maximum entity size or maximum workspace size, the method determines the position of the center point of each entity, the diameter (D) of each entity's perimeter, and the dimensions of the workspace.

BRIEF DESCRIPTION OF THE DRAWINGS

The above and other objects, features, and advantages of the present invention will become more apparent in light of the following detailed description of an exemplary embodiment taken thereof in conjunction with the attached drawings in which:

FIG. 7 is a flowchart illustrating an overall method of arranging entities within a workspace in accordance with an embodiment of the present invention; and FIGS. 8–10 are flowcharts illustrating sub-steps of the overall method of arranging entities within a workspace in accordance with an embodiment of the present invention.

DETAILED DESCRIPTION OF PREFERRED EMBODIMENTS

Figure 1A:
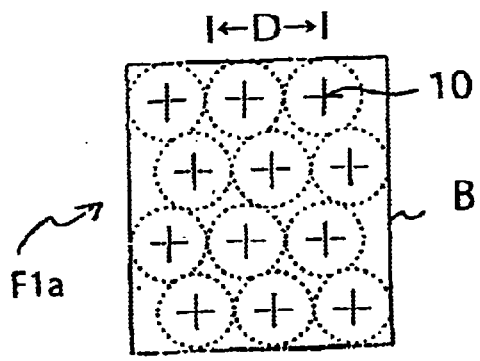
FIGS. 1A–6B are diagrams illustrating various lattice forms for arranging entities in accordance with specific embodiments of the present invention.

The presently disclosed embodiments of arranging entities in a two-dimensional lattice may be may be implemented as a method of several steps, an apparatus or an article of manufacture. For example, the presently disclosed embodiments of arranging entities in a two-dimensional lattice may be implemented using a series of programmable instructions, which may be stored on a computer usable medium. Examples of such media include a memory media such as a magnetic disk, optical disk or the like and may be implemented or executed in any suitable apparatus for implementing the instructions. Alternatively, a system including a microprocessor may be utilized to execute the programmable instructions and a memory to store the associated data is suitable, such as a computer. Additionally, the presently disclosed embodiments may be implemented by transmitting a computer data signal embodied in a transmission medium, for example, by transmission over the Internet, whereby the computer data signal includes various code segments. Those having ordinary skill in the art will recognize that the presently disclosed embodiments of arranging entities in a two-dimensional lattice may be implemented in many variations and such variations need not be illustrated here to avoid obscuring the present invention in unnecessary detail.

Turning now to the drawings, a method in accordance with the present invention will be described first with reference to the several various arrangements of entities (hereinafter "lattice forms") illustrated in FIGS. 1A–6B, and referred to as lattice forms F1a, F1b, F2a, F2b, F3a, F3b, F4, F5, F6a, and F6b, respectively.

Here, for illustrative purposes, a workspace will be shown and described as a bounding region which may be in the form of a rectangular area defined by a lattice bounding box. However, any two dimensional geometric shape may be incorporated herein with little or no modification to the present invention. Also, for purposes of the present invention, an entity is defined as any displayed element (text, drawing, artwork, photograph etc.), any entity used to specify action within a given region (e.g. a mask, filter, grid, indent, pit etc.), a physical object, or any combination or grouping thereof. In one application, the present invention may be used to place arrange and display elements as part of a graphical user interface such as determining placement of menu choices, text boxes, or images. Other applications for the present invention include arranging elements of an electronic document; arranging components of a blueprint or design layout such as for manufacturing components, landscape designs for arranging plantings, garment fabric or sewing designs; arranging physical entities in a given space, for example, an industrial robot may incorporate the present invention to determine an optimal way to arrange or package objects.

The method in accordance with one preferred embodiment of the present invention arranges entities according to six main different lattice structures. Each structure utilizes rows parallel to the x-axis and columns parallel to the y-axis, with the x and y axes being perpendicular to each other. The distance between adjacent rows is uniform—i.e. identical between all adjacent rows in a lattice produced by the method. The distance between adjacent columns is uniform—i.e. identical between all adjacent columns in a lattice produced by the method. The uniform distance between adjacent rows is not necessarily the same as the uniform distance between adjacent columns.

In each of FIGS. 1A–6B the following conventions apply:
 a "+" symbol denotes the center of the entity;
 a circle drawn in phantom or dashed lines denotes the area within the entity's diameter; and
 a line forming a box around the perimeter of the figure denotes the lattice bounding box.

The term "interleaved", when used in reference to rows, denotes packed arrangements in which an entity's center, except that of the first or last entity in a row, is located a distance D from the centers of the two entities adjacent to it on the rows immediately above and below it, but is a distance D or greater from the centers of adjacent entities on the same row. This is evident with careful inspection of FIGS. 3–6.

Figure 1B:
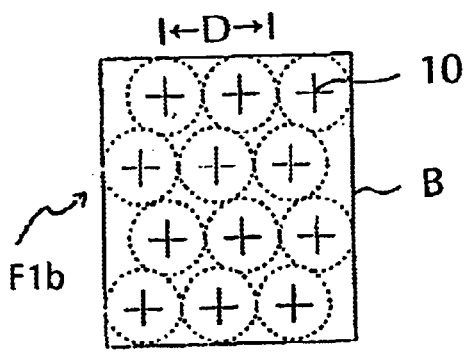

FIGS. 1A and 1B show two variations of a first main lattice Form structure designated as Forms F1a and F1b, respectively. Each of lattice Forms F1a and F1b are defined by a bounding box contain the same number of entities in each row, with the center 10 of each entity being distance D from the centers of adjacent entities on the same row. When a Form F1a or F1b lattice contains more than one row, entities are distance D from only one entity, never more, in each of the adjacent rows immediately above and/or below it.

Figure 2A:
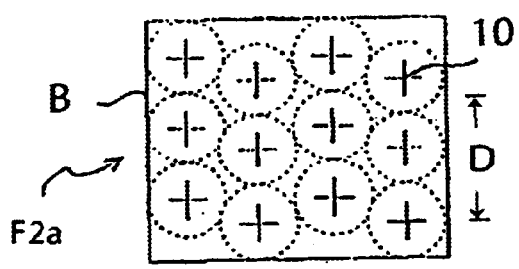
Figure 2B:
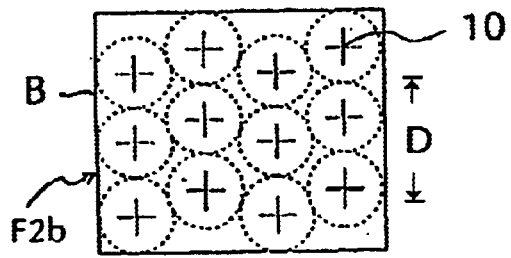

Referring now to FIGS. 2A and 2B, two variations of a second main lattice Form structure are illustrated as Forms F2a and F2b each of which contains the same number of entities in each column, the center 10 of each entity being distance D from the centers of adjacent entities in the same column. When either a Form F2a or F2b lattice contains more than one column, entities are distance D from only one entity, never more, in each of the adjacent columns immediately to the right and/or left of it.

Figure 3A:
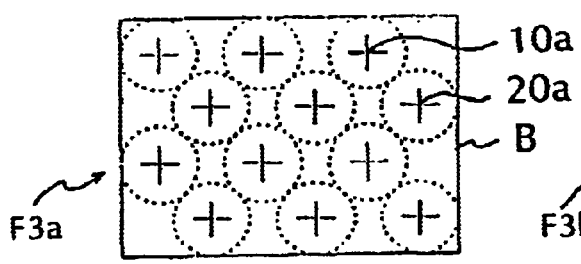
Figure 3B:
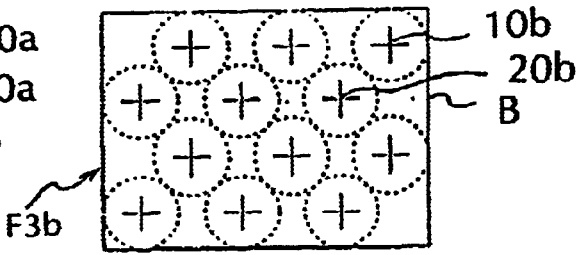

Referring now to FIGS. 3A and 3B, two variations of a third main lattice Form structure are illustrated as Forms F3a and F3b. In each of these forms the lattice is composed of interleaved rows in which all rows contain the same number of entities. Assuming rows are numbered 1, 2, 3, 4 . . . , in Form 3a the centers 10a of entities in odd-numbered rows are placed closest to the left side of the bounding box B and the centers 20a of entities in even-numbered rows are placed closest to the right side of the bounding box B. In Form 3b the centers 10b of entities in odd-numbered rows are placed closest to the right side of the bounding box B and the centers 20a of entities in even numbered rows are placed closest to the left side of the bounding box B.

Figure 4:
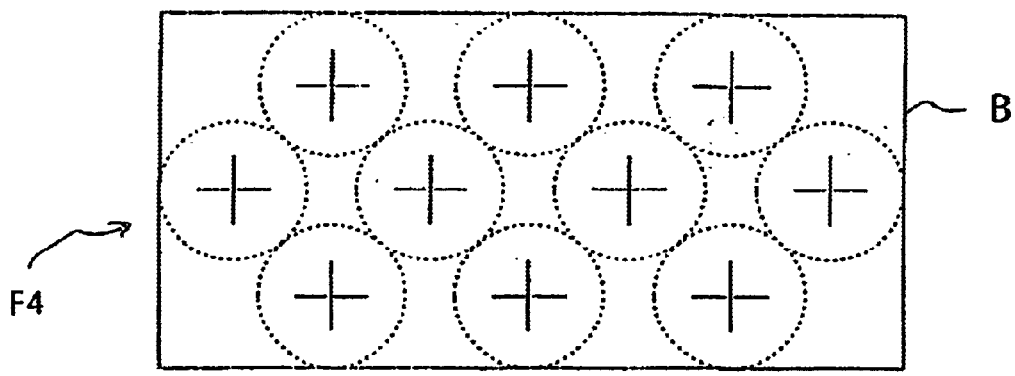

Referring now to FIG. 4, a fourth main lattice form structure is illustrated as Form F4 which is composed of an odd number of interleaved rows, in which the number of entities in each row alternates between C and C+1, and for which a solution exists to the equation $N=RC+((R-1)/2)$, where R is the odd number of rows in the lattice, and where C is any positive integer greater than zero. In this lattice Form, both the first and last rows contain C entities.

Figure 5:
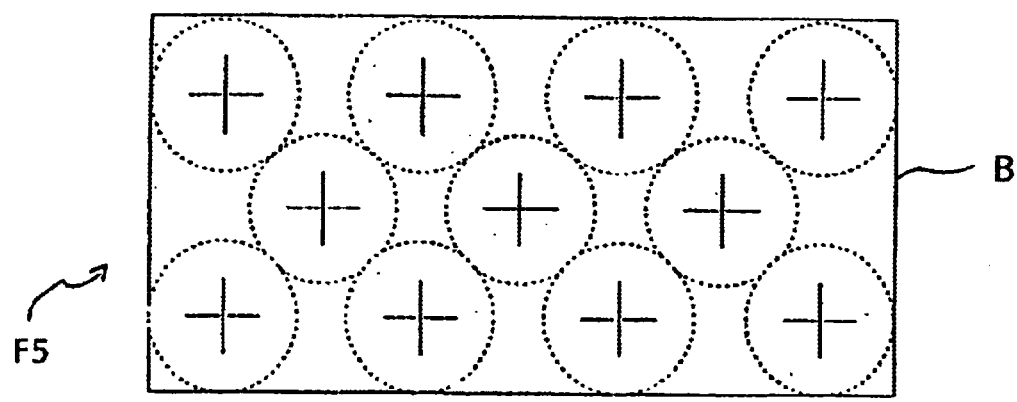

Referring now to FIG. 5, a fifth main lattice form is illustrated as Form F5, which is composed of an odd number of interleaved rows, in which the number of entities in each row alternates between C+1 and C, and for which a solution exists to the equation $N=RC+((R+1)/2)$, where R is the odd number of rows in the lattice, where C is any positive integer greater than one. In this lattice Form, both the first and last rows contain C+1 entities.

Figure 6A:
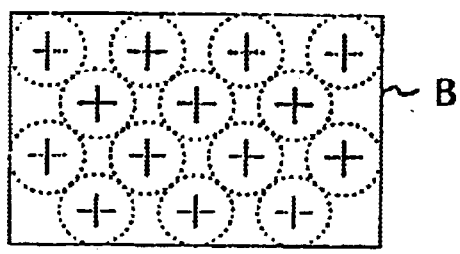
Figure 6B:
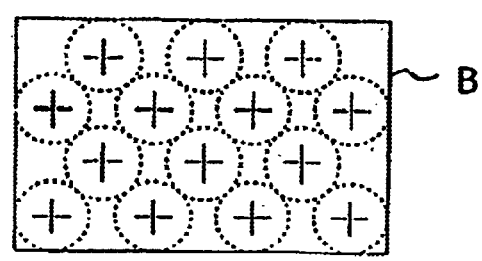

Referring now to FIGS. 6A and 6B, two variations of a sixth main lattice Form structure are illustrated as Forms F6a and F6b and are composed of an even number of interleaved rows, in which the number of entities in each row alternates between C and C+1, that satisfies the equation $N=R(C+½)$, where R is the even number of rows in the lattice, and where C is any integer value greater than zero. In Form 6a, the top row of the lattice contains C+1 entities. In Form 6b, the top row of the lattice contains C entities.

Having surveyed some exemplary lattice forms which may be employed in accordance with a preferred embodiment of the present invention, the steps to carry out the method in accordance with an embodiment will now be described with reference to FIG. 7. In step S1, all of the applicable lattices that prove optimal for the number of entities input are determined as will be described in greater detail further herein. Then, in step S2, the dimensions of the bounding box as input are used in calculations to determine the uniform distance for the columns and rows of each applicable lattice determined in step S1. In step S3, the optimal lattice is selected from all the applicable lattices.

Finally, the positions of the entities are plotted using the optimal lattice in step S4.

Figure 9:
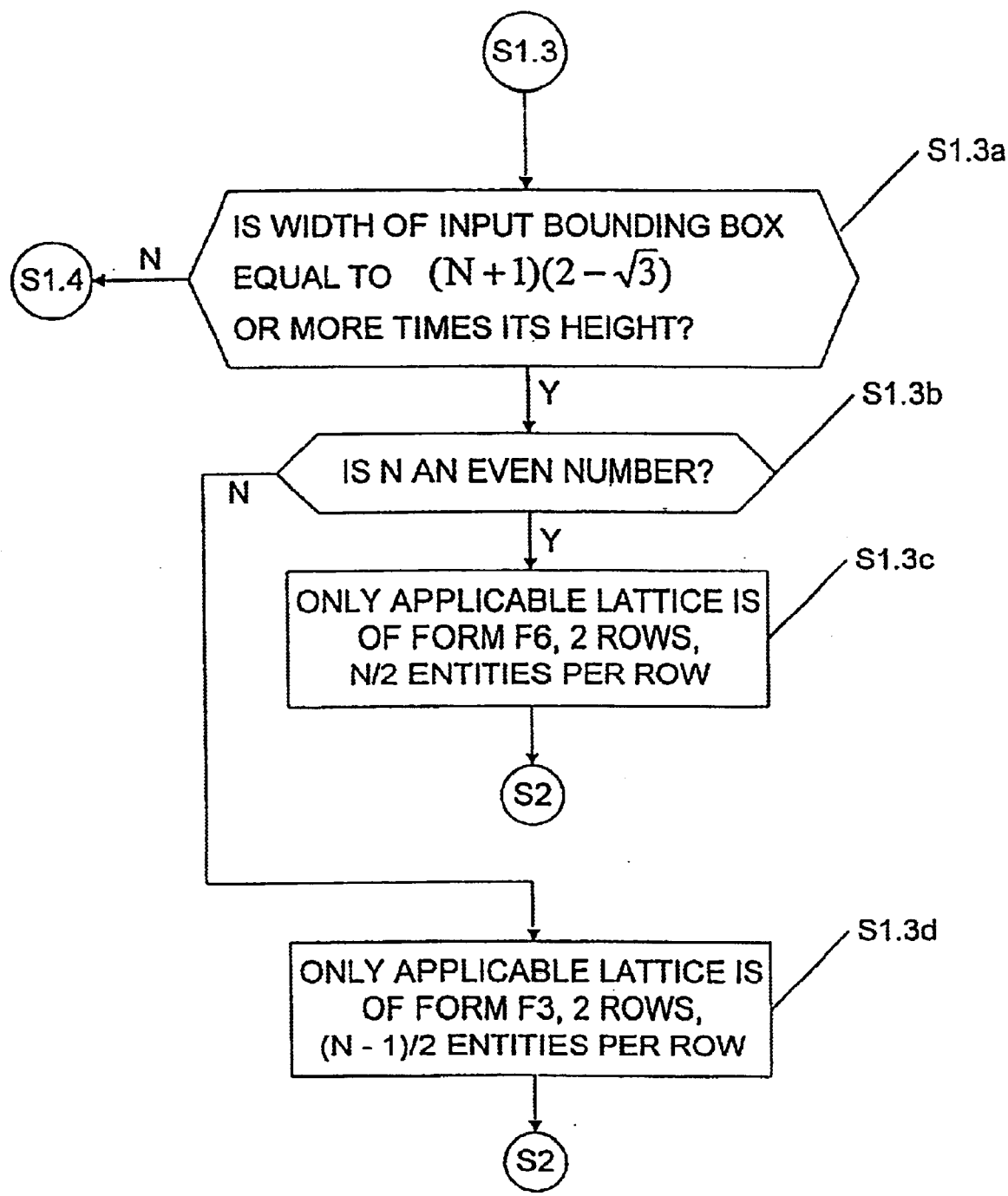

FIGS. 8–10 further detail step S1 of FIG. 7, that is, the sub-steps involved in determining all the applicable lattices. In step S1, all the possible row and column arrangements and lattice forms applicable for the number of entities and bounding box dimensions input are determined. Each applicable combination of row-column arrangements and lattice Form is saved in a "list of applicable lattices" for reference in subsequent steps. The bounding box dimensions input (hereinafter the "input bounding box") may, in some cases, be slightly changed in the final resulting bounding box (hereinafter the "actual bounding box").

Referring to FIG. 8, in step S1.1a it is determined whether the width of the actual bounding box is N or more times its height, and if so, the list of applicable lattices is limited to Forms F1a and F1b, with one row and N entities per row (N represents the given number of entities), in step S1.1b. Forms F1a and F1b, along with their row counts and entities per row, are then added to the list of applicable lattices before proceeding to step S2.

If the width of the actual bounding box is not N or more times larger than the height, in step S1.2a, it is determined whether the height of the input bounding box is N or more times its width, and if so, the list of applicable lattices is limited to Forms F2a and F2b with N rows and 1 entities per row, in step S1.2b. Forms F2a and F2b, along with their row counts and entities per row, are then added to the list of applicable lattices, before proceeding to Step S2.

With reference now to FIG. 9, in step S1.3a, it is determined whether the width of the input bounding box is $(N+1)(2-\sqrt{3})$ or more times its height. If so, and if N is determined to be an even number in step S1.3b, then the only applicable lattice Forms are Forms F6a and F6b, with 2 rows and N/2 entities per row. Forms F6a and F6b, along with their row counts and entities per row are then added to the list of applicable lattices in step S1.3c before proceeding to step S1. However, if N is determined to be an odd number in step S1.3b, then the only applicable lattice Forms are F3a and F3b with 2 rows and (N-1)/2 entities in its shortest row. Forms F3a and F3b, along with their row counts and number of entities in the shortest row, are then added to the list of applicable lattices in step S1.3d, before proceeding to step S2.

With reference now to FIG. 10, in step S1.4a, it is determined whether the height of input bounding box is $(N+1)(2-\sqrt{3})$ or more times its width, and if so the only applicable lattice Forms are F3s and F3b with N rows and 1 entity per row. Forms F3a and F3b are then added, along with their row counts and number of entities per row, to the list of applicable lattices in step S1.4b, before proceeding to step S2.

However, if in step S1.4c, the height of the bounding box is not equal to $(N+1)(2-\sqrt{3})$ or more times its width, then in step S1.5a the list of applicable lattices is determined by iterating over all possible row counts beginning with 2 rows and testing up to N rows, where N is the number of entities. Where there are row counts for which there exists an integer C such that the number of entities is equal to RC, where R represents the row count and C represents the number of entities per row, Forms F2a and F2b, along with their row counts and values of C, are added to the list of applicable lattices and, for row counts that are less than the number of entities, forms F1a, F1b, F3a and F3b, each with the same row count and entities per row, are added to the list of applicable lattices in steps S1.5b and S1.5c.

However, where there are odd-numbered row counts for which an integer value of C exists such that the number of entities is equal to RC+(R−1)/2, where R represents the row count and C represents the number of entities in the shortest row, Form F4, along with its row count and value of C, is added to the list of applicable lattices, also in steps S1.5b and S1.5c.

Alternatively, where there are odd-numbered row counts for which an integer value of C exists such that the number of entities is equal to RC+(R+1)/2, where R represents the row count and C represents the number of entities in the shortest row, Form F5, along with its row count and value of C, is added to the list of applicable lattices, also in steps S1.5b and S1.5c.

And, where there are even-numbered row counts for which an integer value of C exists such that the number of entities is equal to R(C+0.5), where R represents the row count, Forms F6a and F6b, along with their row counts and values of C, are added to the list of applicable lattices, also in steps S1.5b and S1.5c.

In step S2, the size of the actual bounding box dimensions and the diameter of the entity perimeter is determined for each lattice from the list of applicable lattices determined in S1. In some cases the actual bounding box will have the same dimensions as the input bounding box. In other cases either the actual bounding box's width or height will be smaller than that of the input bounding box.

For lattices of Forms F1a and F1b that contain only a single row, as determined in step S1.1a and S1.1b, both the diameter of the entity perimeter and the height of the actual bounding box is determined to be equal to the height of the input bounding box. If the width of the input bounding box exceeds the maximum actual bounding box width, this maximum width being N times the height of the actual bounding box, the width of the actual bounding box is used as the maximum width. Otherwise, the width of the actual bounding box is determined to be equal to that of the input bounding box.

For lattices of Forms F2a and F2b, as determined in steps S1.2a and S1.2b, both the diameter of the entity perimeter and the width of the actual bounding box is determined to be equal to the width of the input bounding box. If the height of the input bounding box exceeds the maximum actual bounding box height, this maximum height being N times the height of the actual bounding box, the height of the actual bounding box is used as the maximum height. Otherwise, the height of the actual bounding box is determined to be equal to that of the input bounding box.

For lattices of Forms F3a and F3b that were determined by steps S1.3a, S1.3b and S1.3d or S1.4a-S1.4b, an actual bounding box identical to the input bounding box is utilized and an entity perimeter diameter equal to $$\left((H(2C-1))^2 + (W(R-1))^2 - \left((2C-1)(R-1)\left(\sqrt{2WH + ((2C-1)^2 - 1)H2 + ((R-1)^2 - 1)W^2)}\right)\right)\right) / ((R-1)^2 + (2C-1)^2 - ((2C-1)^2)((R-1)^2))$$

is utilized, where C is the number of entities in the shortest row of the lattice, R is the number of rows in the lattice, H is the height of the actual bounding box, and W is the width of the actual bounding box.

For lattices of Forms F6a and F6b that were determined by steps S1.3a-S1.3c, an actual bounding box identical to the input bounding box is utilized, and an entity perimeter diameter equal to $$\left(H(4C^2) + W(R-1)^2 - \left(2C(R-1)\left(\sqrt{(2WH + ((4C^22)-1)H^2 + ((R-1)^2 - 1)W^2)}\right)\right)\right) \Big/ ((R-1)^2(4C^2) - (4C^2) - (4C^2)(R-1)^2)$$

is utilized, where C is the number of entities in the shortest row of the lattice, R is the number of rows in the lattice, H is the height of the actual bounding box, and W is the width of the actual bounding box.

To determine the actual bounding box dimensions and entity perimeter diameter for lattices of Forms F1a and F1b which contain more than one row, an upper threshold of $(2C+1)/((R1)(\sqrt{3})+2)$ is first determined where C is the number of entities per row of the lattice and R is the number of rows in the lattice. If the width of the input bounding box $$\left(W + (C-1)\left(RH(C-1)/2 - \sqrt{((C-2)CH^2 + RWH - ((R/2)^2 - 1)W^2)}\right)\right) \Big/ (((R/2)^2 - 1)(C-1)^2 + 1)$$

is more than this its height multiplied by this upper threshold, the width of the actual bounding box is determined to be this upper threshold multiplied by the height of the input bounding box, and the height of the actual bounding box to be the same as that of the input bounding box.

Next, a lower threshold of C/R is determined, where C is the number of entities per row of the lattice and R is the number of rows in the lattice. If the width of the input bounding box is less than this lower threshold multiplied by its height, the height of the actual bounding box is determined to be the width of the input bounding box divided by this lower threshold, and the width of the actual bounding box is determined to be the same as that of the input bounding box.

When the ratio of the input bounding box's width divided by its height lies between the upper and lower thresholds inclusively, the actual bounding box utilized is identical to the input bounding box.

Next, the entity perimeter diameter of $$(H + (R-1)(CW(R-1) - \sqrt{((R-2)RW^2 + 2CWH - (C^2 - 1)H^2)})) \Big/ ((C^2-1)(R-1)^2 + 1)$$

is determined, where C is the number of entities per row of the lattice, R is the number of rows in the lattice, H is the height of the actual bounding box, and W is the width of the actual bounding box.

To determine the actual bounding box dimensions and entity perimeter diameter for lattices of Forms F2a and F2b, which were determined by steps S1.5a-S1.5c, an upper threshold of 2C/R is first determined, where C is the number of entities per row of the lattice and R is the number of rows in the lattice. If the width of the input bounding box is more than its height multiplied by this upper threshold, the width of the actual bounding box is determined to be this upper threshold multiplied by the height of the input bounding box and the height of the actual bounding box is determined to be the same as that of the input bounding box.

Next, a lower threshold of $(2+(C\ 1)*\sqrt{3})/(R+1)$ is determined, where C is the number of entities per row of the lattice and R is the number of rows in the lattice. If the width of the input bounding box is less than this lower threshold multiplied by its height, the height of the actual bounding box is determined to be the width of the input bounding box divided by this lower threshold, and the width of the actual bounding box is determined to be the same as that of the input bounding box.

When the ratio of the input bounding box's width divided by its height lies between the upper and lower thresholds inclusively, the actual bounding box utilized is identical to the input bounding box.

Next, the entity perimeter diameter of $$\left(W + (C-1)\left(RH(C-1)/2 - \sqrt{((C-2)CH^2 + RWH - ((R/2)^2 - 1)W^2)}\right)\right) \Big/ (((R/2)^2 - 1)(C-1)^2 + 1)$$

is determined, where C is the number of entities per row of the lattice, R is the number of rows in the lattice, H is the height of the actual bounding box, and W is the width of the actual bounding box.

To determine the actual bounding box dimensions and entity perimeter diameter for lattices of Forms F3a and F3b that were determined by steps S1.5a-S1.5c, an upper threshold of $((2C-1)*\sqrt{3}+2)/(R+1)$ is first determined, where C is the number of entities per row of the lattice and R is the number of rows in the lattice. If the width of the input bounding box is more than its height multiplied by this upper threshold, the width of the actual bounding box is determined to be this upper threshold multiplied by the height of the input bounding box and the height of the actual bounding box is determined to be the same as that of the input bounding box.

Next, a lower threshold $(2C+1)/((R\ 1)*\sqrt{3}+2)$ is determined, where C is the number of entities per row of the lattice and R is the number of rows in the lattice. If the width of the input bounding box is less than its height multiplied by this lower threshold, the height of the actual bounding box is determined to be the width of the input bounding box divided by this lower threshold, and the width of the actual bounding box is determined to be the same as that of the input bounding box.

When the ratio of the input bounding box's width divided by its height lies between the upper and lower thresholds inclusively, the actual bounding box utilized is identical to the input bounding box.

Next, the entity perimeter diameter of $$\left(H(2C-1)^2 + W(R-1)^2 - \left((2C-1)(R-1)\left(\sqrt{(2WH + ((2C-1)^2-1)H^2 + ((R-1)^2-1)W^2)}\right)\right)\right) \Big/ ((R-1)^2 + (2C-1)^2 + ((2C-1)^2)((R-1)^2))$$

is determined, where C is the number of entities per row of the lattice, R is the number of rows in the lattice, H is the height of the actual bounding box, and W is the width of the actual bounding box.

To determine the actual bounding box dimensions and entity perimeter diameter for lattices of forms F4, F5, F6a, and F6b that were determined by steps S1.5a-S1.5c, an upper threshold of $(2C*\sqrt{3}+2)/(R+1)$ is first determined where C is the number of entities in the shortest row of the lattice and R is the number of rows in the lattice. If the width of the input bounding box is more than its height multiplied by this upper threshold, the width of the actual bounding box is determined to be this threshold multiplied by the height of the input bounding box and the height of the actual bounding box is determined to be the same as that of the input bounding box.

Next, a lower threshold $(2C+2)/((R-1)*\sqrt{3}+2)$ is determined, where C is the number of entities in the shortest row of the lattice and R is the number of rows in the lattice. If the width of the input bounding box is less than its height multiplied by this lower threshold, the height of the actual bounding box is determined to be the width of the input bounding box divided by this lower threshold, and the width of the actual bounding box to be the same as that of the input bounding box.

When the ratio of the input bounding box's width divided by its height lies between the upper and lower thresholds inclusively, the actual bounding box utilized is identical to the input bounding box.

Next, the entity perimeter diameter of $$\left(H(4C^2) + W(R-1)^2 - \left(2C(R-1)\left(\sqrt{(2WH + ((4C^2)-1)H^2 + ((R-1)^2-1))}\right)\right)\right) \Big/ ((R-1)^2 + (4C^2) - (4C^2)(R-1)^2)$$

is determined, where C is the number of entities in the shortest row of the lattice, R is the number of rows in the lattice, H is the height of the actual bounding box, and W is the width of the actual bounding box.

Having determined the actual bounding box dimensions and entity perimeter for each applicable lattice in step S2, the method of the present invention next determines the most optimal lattice from the list of applicable lattices in step S3.

If the indicated preference was for a maximum diameter perimeter, the method determines the most optimal lattice is determined to be the one with the lowest row count and lowest Form number that yielded the largest perimeter diameter. The lowest row count and lowest Form number requirements are arbitrary and are only meant to make a determination in the very unlikely event of two or more lattices producing the same maximal diameter. If the indicated preference was for a maximum actual bounding box, the most optimal lattice is determined to be the one with the lowest row count and lowest Form number with the actual bounding box that yielded the largest perimeter diameter for that size of actual bounding box. The lowest row count and lowest Form number requirements are arbitrary and are only meant to make a determination in the very unlikely event of two or more lattices producing the same maximal diameter in the same actual bounding box.

The lattice determined in step S3 will be referred to hereinafter as the "optimal lattice".

Having determined the optimal lattice in step S3, the position of each entity within the actual bounding box of the optimal lattice is determined in step S4. Here, a row enumeration of 1, 2, 3 . . . top to bottom and a column enumeration of 1, 2, 3 . . . left to right is assumed. References to D hereinafter refer to the perimeter diameter determined in step S2 for the optimal lattice in which entities are being positioned.

When the optimal lattice is of Form F1a or F1b, the center of each entity is positioned a horizontal distance of exactly D apart on each row.

When Form F1a is requested, the center of the leftmost entity on each odd-numbered row is placed a horizontal distance of D/2 inward from the left edge of the actual bounding box, and the center of the rightmost entity on each even-numbered row is placed a horizontal distance of D/2 inward from the right edge of the actual bounding box.

When Form F1b is requested, the center of the rightmost entity on each odd-numbered row is placed a horizontal distance of D/2 inward from the right edge of the actual bounding box, and the center of the leftmost entity on each even-numbered row is placed a horizontal distance of D/2 inward from the left edge of the actual bounding box.

The centers of entities in the first row of the lattice share a vertical position a vertical distance of D/2 downward from the top boundary of the actual bounding box. The centers of entities in the last row of the lattice share a vertical position a vertical distance of D/2 upward from the bottom boundary of the actual bounding box. Rows between the first and last rows of the lattice are positioned such that they are each spaced a uniform distance vertically between the first and last rows of the lattice.

When the optimal lattice is of Forms F2a and F2b, the center of each entity is positioned a vertical distance of exactly D apart in each column.

When Form F2a is requested, the center of the uppermost entity in each odd-numbered column is placed a vertical distance of D/2 downward from the top edge of the actual bounding box, and the center of the bottom-most entity in each even-numbered column is placed a vertical distance of D/2 upward from the bottom edge of the actual bounding box.

When Form F2b is requested, the center of the bottom-most entity in each odd-numbered column is placed a vertical distance of D/2 upward from the bottom edge of the actual bounding box, and the center of the uppermost entity in each even-numbered column is placed a vertical distance of D/2 downward from the top edge of the actual bounding box.

The centers of entities in the first column of the lattice share a horizontal position a horizontal distance of D/2 inward from the left boundary of the actual bounding box. The centers of entities in the last column of the lattice share a horizontal position a horizontal distance of D/2 inward from the right boundary of the actual bounding box. Columns between the first and last columns of the lattice are positioned such that they are each spaced a uniform distance horizontally between the first and last rows of the lattice.

When the optimal lattice is of Forms F3$a$ and F3$b$, the center of each entity is positioned in the same row a horizontal distance apart equal to 2(W−D)/(2C−1)−D, where W is the width of the actual bounding box, C is the number of entities per row of the lattice and D is the perimeter diameter determined in step S2.

When Form F3$a$ is requested, the center of the leftmost entity on each odd-numbered row is placed a horizontal distance of D/2 inward from the left edge of the actual bounding box, and the center of the rightmost entity on each even-numbered row is placed a horizontal distance of D/2 inward from the right edge of the actual bounding box.

When Form F3$b$ is requested, the center of the rightmost entity on each odd-numbered row is placed a horizontal distance of D/2 inward from the right edge of the actual bounding box, and the center of the leftmost entity on each even-numbered row is placed a horizontal distance of D/2 inward from the left edge of the actual bounding box.

The centers of entities in the first row of the lattice share a vertical position a vertical distance of D/2 downward from the top boundary of the actual bounding box. The centers of entities in the last row of the lattice share a vertical position a vertical distance of D/2 upward from the bottom boundary of the actual bounding box. Rows between the first and last rows of the lattice are positioned such that they are each spaced a uniform distance vertically between the first and last rows of the lattice.

When the optimal lattice is of Form F4, F5, F6$a$ or F6$b$, the center of each entity is positioned in the same row a horizontal distance apart equal to (W−D(C+1))/C, where W is the width of the actual bounding box, C is the number of entities in the shortest row of the lattice and D is the perimeter diameter determined in step S2.

When the optimal lattice is of Form F6$a$, or when the optimal lattice is of Form F5, odd-numbered rows contain C+1 entities and even-numbered rows contain C entities. The center of the leftmost entity on each odd-numbered row is placed a horizontal distance of D/2 inward from the left edge of the actual bounding box, and the center of the leftmost entity on each even-numbered row is placed a horizontal distance equal to (W−CD−(C−1)((W−D(C+1))/C))/2 inward from the left edge of the actual bounding box, where W is the width of the actual bounding box, C is the number of entities in the shortest row of the lattice and D is the perimeter diameter determined in step S2.

When the optimal lattice is of Form F6$b$, or when the optimal lattice is of Form F4, odd-numbered rows contain C entities and even-numbered rows contain C entities. The center of the leftmost entity on each odd-numbered row is placed a horizontal distance equal to (W−CD−(C−1)((W−D(C+1))/C))/2 inward from the left edge of the actual bounding box, and the center of the leftmost entity on each even-numbered row is placed a horizontal distance of D/2 inward from the left edge of the actual bounding box, where W is the width of the actual bounding box, C is the number of entities in the shortest row of the lattice and D is the perimeter diameter determined in step S2.

The centers of entities in the first row of the lattice share a vertical position a vertical distance of D/2 downward from the top boundary of the actual bounding box. The centers of entities in the last row of the lattice share a vertical position a vertical distance of D/2 upward from the bottom boundary of the actual bounding box. Rows between the first and last rows of the lattice are positioned such that they are each spaced a uniform distance vertically between the first and last rows of the lattice.

While the present invention has been described with reference to the preferred embodiments, they represent mere exemplary applications. Thus, it is to be clearly understood that many variations can be made by anyone having ordinary skill in the art while staying with the scope and spirit of the present invention.

What is claimed is:

1. A method in a graphics display system for arranging entities in a two-dimensional lattice, the method comprising the steps of:

determining all applicable two-dimensional lattice forms from a predetermined group of lattice forms for a predetermined number of entities to be arranged;

determining the dimensions of a bounding region and a uniform separation distance between a center point of each entity for each applicable lattice form;

selecting an optimal applicable two-dimensional lattice form; and plotting positions of each of the predetermined number of entities within the optimal applicable two-dimensional lattice form.

2. A method according to claim 1, wherein the applicable two-dimensional lattice forms are selected from a group of lattice forms consisting of a first lattice form having the same number of entities in each row, a second lattice form having the same number of entities in each column, a third lattice form having an even number of interleaved rows in which all rows contain the same number of entities, a fourth lattice form having an odd number of interleaved rows in which all rows contain the same number of entities, a fifth lattice form having an odd number of rows in which the number of entities in adjacent rows alternates between C and C+1, a sixth lattice form having an odd number of rows in which the number of entities in adjacent rows alternates between C+1 and C, and a seventh lattice form having an even number of interleaved rows in which the number of entities in each row alternates between C and C+1.

3. A method according to claim 1, wherein the applicable two-dimensional lattice forms are selected from a group of lattice forms each having a series of rows and columns wherein the distance between adjacent rows is uniform.

4. A method according to claim 1, wherein the applicable two-dimensional lattice forms are selected from a group of lattice forms each having a series of rows and columns wherein the distance between adjacent columns is uniform.

5. A method in a computer system for displaying visual elements as part of a display in a graphical user interface, the method comprising the steps of:

determining all applicable two-dimensional lattice forms from a predetermined group of lattice forms for a predetermined number of visual elements to be arranged as part of a display;

determining the dimensions of a bounding region and a uniform separation distance between a center point of each visual element for each applicable two-dimensional lattice form;

selecting an optimal two-dimensional applicable lattice form; and displaying the predetermined number of entities within the optimal two-dimensional lattice form on a display.

6. A method according to claim 5, wherein the applicable two-dimensional lattice forms are selected from a group of lattice forms consisting of a first lattice form having the same number of entities in each row, a second lattice form having the same number of entities in each column, a third lattice form having an even number of interleaved rows in which all rows contain the same number of entities, a fourth lattice form having an odd number of interleaved rows in which all rows contain the same number of entities, a fifth lattice form having an odd number of rows in which the number of entities in adjacent rows alternates between C and C+1, a sixth lattice form having an odd number of rows in which the number of entities in adjacent rows alternates between C+1 and C, and a seventh lattice form having an even number of interleaved rows in which the number of entities in each row alternates between C and C+1.

7. A method according to claim 5, wherein the applicable two-dimensional lattice forms are selected from a group of lattice forms each having a series of rows and columns wherein the distance between adjacent rows is uniform.

8. A method according to claim 5, wherein the applicable two-dimensional lattice forms are selected from a group of lattice forms each having a series of rows and columns wherein the distance between adjacent columns is uniform.

9. An article of manufacture, which comprises:
    a computer usable medium having computer readable program code means embodied in the medium for causing a predetermined number of entities to be arranged in a two-dimensional lattice form, the computer readable program code means in the article of manufacture including:
        computer readable program code means for causing a computer to select applicable two-dimensional lattice forms from a group of two-dimensional lattice forms;
        computer readable program code means for causing the computer to determine a bounding region and a uniform separation distance between a center point of each entity for each selected applicable two-dimensional lattice form;
        computer readable program code means for causing a computer to select an optimal applicable two-dimensional lattice form from the selected applicable two-dimensional lattice forms; and
        computer readable program code means for causing a computer to plot positions of the predetermined number of entities within the optimal applicable two-dimensional lattice form.

10. An article of manufacture according to claim 9, wherein the applicable two-dimensional lattice forms are selected from a group of lattice forms consisting of a first lattice form having the same number of entities in each row, a second lattice form having the same number of entities in each column, a third lattice form having an even number of interleaved rows in which all rows contain the same number of entities, a fourth lattice form having an odd number of interleaved rows in which all rows contain the same number of entities, a fifth lattice form having an odd number of rows in which the number of entities in adjacent rows alternates between C and C+1, a sixth lattice form having an odd number of rows in which the number of entities in adjacent rows alternates between C+1 and C, and a seventh lattice form having an even number of interleaved rows in which the number of entities in each row alternates between C and C+1.

11. An article of manufacture according to claim 9, wherein the applicable two-dimensional lattice forms are selected from a group of lattice forms each having a series of rows and columns wherein the distance between adjacent rows is uniform.

12. An article of manufacture according to claim 9, wherein the applicable two-dimensional lattice forms are selected from a group of lattice forms each having a series of rows and columns wherein the distance between adjacent columns is uniform.

13. A computer data signal embodied in a transmission medium, which comprises:
    a code segment including instructions for selecting applicable two-dimensional lattice forms from a group of two-dimensional lattice forms;
    a code segment including instructions for determining a bounding region and a uniform separation distance between a center point of each entity for each selected applicable two-dimensional lattice form;
    a code segment including instructions for selecting an optimal applicable two-dimensional lattice form from the selected applicable two-dimensional lattice forms; and
    a code segment including instructions for plotting positions of the predetermined number of entities within the optimal applicable two-dimensional lattice form.

14. A computer data signal embodied in a transmission medium according to claim 13, wherein the applicable two-dimensional lattice forms are selected from a group of lattice forms consisting of a first lattice form having the same number of entities in each row, a second lattice form having the same number of entities in each column, a third lattice form having an even number of interleaved rows in which all rows contain the same number of entities, a fourth lattice form having an odd number of interleaved rows in which all rows contain the same number of entities, a fifth lattice form having an odd number of rows in which the number of entities in adjacent rows alternates between C and C+1, a sixth lattice form having an odd number of rows in which the number of entities in adjacent rows alternates between C+1 and C, and a seventh lattice form having an even number of interleaved rows in which the number of entities in each row alternates between C and C+1.

15. A computer data signal embodied in a transmission medium according to claim 13, wherein the applicable two-dimensional lattice forms are selected from a group of lattice forms each having a series of rows and columns wherein the distance between adjacent rows is uniform.

16. A computer data signal embodied in a transmission medium according to claim 13, wherein the applicable two-dimensional lattice forms are selected from a group of lattice forms each having a series of rows and columns wherein the distance between adjacent columns is uniform.

* * * * *